United States Patent [19]

Baliga et al.

[11] Patent Number: 4,857,983
[45] Date of Patent: Aug. 15, 1989

[54] MONOLITHICALLY INTEGRATED SEMICONDUCTOR DEVICE HAVING BIDIRECTIONAL CONDUCTING CAPABILITY AND METHOD OF FABRICATION

[75] Inventors: Bantval J. Baliga; Deva N. Pattanayak, both of Schenectady, N.Y.

[73] Assignee: General Electric Company, Schenectady, N.Y.

[21] Appl. No.: 51,430

[22] Filed: May 19, 1987

[51] Int. Cl.$^4$ .......................................... H01L 29/74
[52] U.S. Cl. ....................................... 357/38; 357/20; 357/23.4; 357/39; 357/43; 357/86
[58] Field of Search ...................... 357/20, 38, 43, 39, 357/86, 23.4

[56] References Cited

U.S. PATENT DOCUMENTS

| | | | |
|---|---|---|---|
| 4,199,774 | 4/1980 | Plummer | 357/41 |
| 4,364,073 | 12/1982 | Becke et al. | 357/23 |
| 4,443,931 | 4/1984 | Baliga et al. | 29/571 |
| 4,604,638 | 8/1986 | Matsuda | 357/38 |

OTHER PUBLICATIONS

Plummer, James D., "Insulated-Gate Planar Thyristors: I-Structure and Basic Operation", *IEEE Transactions on Electron Devices*, vol. ED-27, No. 2, Feb. 1980, pp. 380-386.
Russell, J. P. et al., "The COMFET-A New High Conductance MOS-Gated Device", *IEEE Electric Device Letters*, vol. EDL-4, No. 3, Mar. 1983, pp. 63-65.
Scharf, B. W. et al., "Insulated-Gate Planar Thyristors: II-Quantitative Modeling", *IEEE Transactions on Electron Devices*, vol. ED-27, No. 3, pp. 387-393.

*Primary Examiner*—Joseph E. Clawson, Jr.
*Attorney, Agent, or Firm*—Robert Ochis; James C. Davis, Jr.; Marvin Snyder

[57] ABSTRACT

The present invention relates generally to monolithically integrated insulated gate semiconductor devices and more particularly to an improved structure which provides for high current density, low voltage drop conduction in both forward and reverse directions. More particularly, a single insulated gate device can initiate and interrupt current flow in both the forward and reverse directions.

24 Claims, 14 Drawing Sheets

MONOLITHICALLY INTEGRATED SEMICONDUCTOR DEVICE HAVING BIDIRECTIONAL CONDUCTING CAPABILITY AND METHOD OF FABRICATION

This application is related to insulated gate semiconductor devices and more particularly to those monolithically integrated semiconductor devices which employ a first portion comprising, for instance, an inherent regeneratively conductive device and a second portion comprising, for instance, an inherent bipolar transistor. The disclosed device includes a five layer inherent structure which drives an inherent bipolar transistor to provide high current flow at low voltage drops in both the forward and reverse directions. The monolithically integrated semiconductor device of the present invention provides for insulated gate controlled conduction in both the forward and reverse directions.

Related Applications

This application is related to U.S. patent application Ser. No. (051,424) for a "Monolithically Integrated Insulated Gate Semiconductor Device"U.S. patent application Ser. No. (051,427) for a "Monolithically Integrated Lateral Insulated Gate Semiconductor Device"; U.S. patent application Ser. No. (051,359) for "Improved Monolithically Integrated Semiconductor Device and Process for Fabrication" and U.S. patent application Ser. No. (051,422) "Monolithically Integrated Bidirectional Lateral Semiconductor Device With Insulated Gate Control in Both Directions and Method of Fabrication" filed concurrently herewith, assigned to the assignee hereof and incorporated by reference herein.

The above-identified applications disclose monolithically integrated semiconductor devices in which a first portion of a semiconductor device comprising, for instance a four layer structure, such as an inherent thyristor, is used to supply a base drive current to a second portion of a semiconductor device comprising a three layer structure, such as an inherent bipolar transistor. These monolithically integrated semiconductor devices are responsive to insulated gate control and conduct current only in the forward direction. These devices make no provision for current conduction in the reverse direction. Accordingly, the previously proposed devices are not particularly attractive for use in AC environments such as appliance control circuits. These therefore exists an unfulfilled need to provide a monolithically integrated insulated gate controlled semiconductor device exhibiting improved conductivity and also providing for insulated gate controlled forward and reverse conduction.

OBJECTS OF THE INVENTION

It is a principal object of the present invention to provide for an improved monolithically integrated insulated gate semiconductor device which exhibits bidirectional conduction.

A further object of the present invention is to provide a monolithically integrated semiconductor device comprising an inherent three layer structure, an inherent four layer structure and an inherent five layer structure, wherein the current conducting state of each structure is controllable by means of a single insulated gate.

An additional feature of the present invention is to provide a single substrate of semiconductor material fabricated with three separate inherent semiconductor structures which through their monolithic combination, improve the function of the integrated device beyond that function which could otherwise be achieved by the individual devices.

Further, it is an additional object of the present invention to provide an insulated gate controlled semiconductor including a MOS gate controlled five layer structure which provides high current conduction at low drive voltages in the reverse direction.

SUMMARY OF THE INVENTION

These and other objects and features of the present invention are achieved in a monolithically integrated insulated gate semiconductor device comprising a first layer of one type conductivity having a second layer of opposite type conductivity disposed thereon. A first region of opposite type conductivity is disposed within the first layer and forms a PN junction therewith. Second and third regions of one type conductivity are disposed within the second layer and form PN junctions therewith. The second region preferably comprises a deep and heavily doped central portion which is surrounded by a shallower and more lightly doped annular region of one type conductivity. Similarly, the third region comprises a lightly doped first portion having a heavily doped ohmic contact second portion disposed therein. A fourth region of opposite type conductivity is disposed within the second region and forms a PN junction therewith. The fourth region, in combination with the second layer, defines a channel portion of the second region disposed therebetween. A fifth region of opposite type conductivity is disposed with in the third region and forms a PN junction therewith. The fifth region, in combination with the second layer, defines a channel portion of the third region. A sixth region of opposite type conductivity is disposed within the third region and overlaps both the first portion and the ohmic contact second portion thereof and forms a PN junction therewith. A portion of the third region is disposed intermediate the fifth and sixth regions.

A first insulated gate structure is disposed over the channel portion of the third region and in response to an appropriate applied bias, couples the fifth region to the second layer. The first insulated gate can be considered a turn on gate. A second insulated gate is disposed over the channel portion of the second region and can overlap the second layer and the fourth region. The second gate can be considered a turn-off gate. A third insulated gate is disposed over a portion of the third region and also overlies portions of the fifth and sixth regions. In response to an applied bias, the third insulated gate couples the fifth region to the sixth region. A first electrode is disposed in ohmic contact with the ohmic contact second portion of the third region, the sixth region, as well as the second and fourth regions. A second electrode is disposed in ohmic contact with the first layer and the first region. When a positive bias is applied to the second electrode with respect to the first electrode, and an appropriate bias is applied to the insulated gate structures, high current density forward conduction is achieved inasmuch as the inherent four layer structure comprising the first and second layers, third and fifth regions, is coupled via the sixth region to the first electrode to thereby foster the establishment of regenerative conduction. The inherent three layer structure comprising the first and second layer and the third region is conductively modulated and exhibits improved conduction. In response to removal of said bias, regenerative conduction ceases. When a negative bias is applied to the second electrode with respect to the first electrode, conduction occurs in the reverse direction through a four layer structure comprising the second region, the second and first layers and the first region. By application of an appropriate bias to the first insulated gate electrode to form a MOS channel between the fourth region and the second layer, the injection from the second region into the second layer is suppressed to turn off the otherwise resulting current flow. Consequently, the device provides for a high density of current conduction in both forward and reverse directions and remains responsive to the insulatd gate control.

A method of fabricating a semiconductor device in accordance with the present invention includes the steps of initially providing a body of semiconductor material comprising a first layer of one type conductivity with a second layer of opposite type conductivity disposed thereon. Either the first or second layer can be the substrate with the other layer being established thereon by epitaxial growth or doping techniques such as implantation or diffusion techniques. Thereafter, in a first preferred embodiment, a first protective layer is provided on a first surface of the semiconductor device. A first window is opened through the first protective layer to expose a first portion of the surface of the first layer. A first region of opposite type conductivity is established within the first layer. Thereafter, the remaining portion of the first protective layer is removed.

A second protective layer is disposed on a second surface of the semiconductor device and second and third windows are opened therein. A first doping is performed through the second and third windows with one type conductivity impurities to establish second and third regions of one type conductivity. The second window and the second region is preferably established in a two step procedure. Initially, a central portion of the second window is opened and a heavy concentration of one type impurities is introduced to form a heavily doped central portion. Thereafter, a second portion of the second window surrounding the first portion of the second window is opened and a second doping is performed with a moderate concentration of one conductivity materials.

The second window is then closed with a first portion of a third protective layer.

Thereafter, the third window is preferably opened through the second protective layer and a third region is established with a light concentration of one type conductivity impurities. Thereafter, a portion of the third window is masked and a heavy concentration of one type conductivity impurities is introduced into the exposed portion of the third region to establish a heavily doped ohmic contact region.

Thereafter, a second portion of the third protective layer is formed within the third window. Fourth, fifth and sixth windows are subsequently opened through the second and third protective layers and opposite conductivity impurities are introduced to establish fourth, fifth and sixth regions of opposite type conductivity within the second and third regions. The fourth, fifth and sixth windows are then refilled with a fourth protective layer such as an oxide layer. Subsequently, a gate layer such as polysilicon layer is deposited atop the protective layers. The polysilicon layer is patterned to establish the desired gate layers and a gate insulated layer is deposited on top of the polysilicon layer. Thereafter, a photolithographic layer is deposited and patterned to provide windows over the protective layers defining the ohmic contact regions. Subsequently, an appropriate etch such as a buffered hydrofluoric etch is used to remove the protective layers and expose the underlying surface of the semiconductor device. Thereafter, metallization layers are applied to provide for a cathode contact to the second and sixth fourth regions as well as the third and fourth regions.

The present invention thus provides for an improved monolithically integrated semiconductor device which exhibits improved and insulated gate controlled conduction in both the forward and reverse directions.

BRIEF DESCRIPTION OF THE DRAWINGS

The features of the present invention which are believed to be novel are specified with particularity in the appended claims. The invention itself, however, both as to organization and method of operation together with additional features, objects and advantages of the monolithically integrated insulated gate semiconductor device and the method of fabrication can be best understood by reference to the following detailed description when considered in conjunction with the accompanying drawings in which:

DETAILED DESCRIPTION OF THE PREFERRED EMBODIMENTS

A monolithically integrated insulated gate semiconductor device of the present invention is applicable to a broad range of semiconductor devices and can be fabricated from a variety of different semiconductor materials. The ensuing description will disclose several preferred embodiments of the monolithically integrated semiconductor device of the present invention as implemented in a silicon substrate because silicon devices or devices fabricated in silicon substrates, make up an overwhelming majority of the currently available semiconductor devices. Consequently, the most commonly encountered applications of the present invention will involve silicon substrate devices. Nevertheless, it is intended that the invention disclosed herein can be advantageously employed in germanium, gallium arsenide and other semiconductor materials. Accordingly, application of the present invention is not intended to be limited to devices fabricated in silicon semiconductor materials, but will encompass those devices fabricated in any of a number of semiconductor materials.

Moreover, while the present description discusses a number of preferred embodiments directed to silicon semiconductor devices, it is intended that these disclosures be considered as illustrative examples of preferred embodiments of the present invention and not as a limitation on the scope or applicability of the present invention. Further, while the illustrated examples concern the improved conductivity monolithically integrated insulated gate semiconductor device in connection with specific insulated gate controlled structures, it is not intended that the monolithically integrated features of the present invention be limited to the disclosed structures. Instead, these devices are included to demonstrate the utility and application of the present invention to what are considered preferred commercial embodiments. Specifically, the present invention is additionally readily applicable to those monolithically integrated inherent structures which employ regenerative conductive action and thus encompass devices including monolithically inherent integrated TRIACs, DIACs as well as thyristors. Further, while the present invention provides for improved current conductivity and current density, it is recognized that the intended benefit will also result from the improved cell structures.

Figure 1:
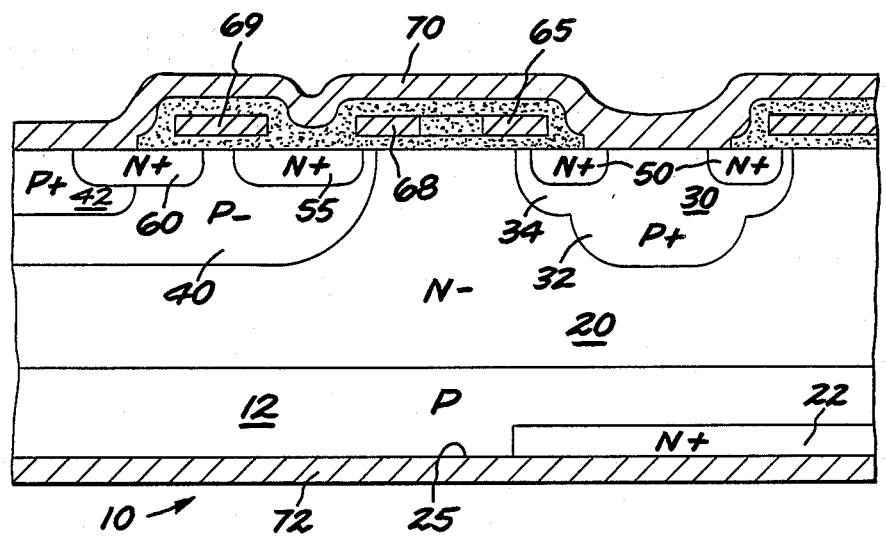
FIG. 1 is a cross-sectional illustration of a first embodiment of a monolithically integrated insulated gate semiconductor device in accordance with the present invention.

Given the corresponding relationship of FIGS. 1 and 2, corresponding parts have been designated with the same reference numeral as an aid to understanding the description of the invention. Various parts of the semiconductor elements, however, have not been drawn to scale. Certain dimensions have been exaggerated in relation to other dimensions in order to present a clearer illustration and understanding of the present invention. Although for the purposes of illustration, the preferred embodiments of the improved conductivity monolithically integrated semiconductor device of the present invention are shown in each particular embodiment to include specific P and N type regions, it is understood that the techniques disclosed herein are equally applicable to monolithically integrated insulated gate semiconductor devices in which the conductivities of the various regions have been reversed to, for instance, provide for the dual of the illustrated device.

Further, although the embodiments illustrated herein are shown in two-dimensional views with various regions having depth and width, it is understood that these regions are illustrations of only a portion of a single cell of a device which is comprised of a plurality of cells arranged in a three-dimensional structure. Accordingly, these regions, when fabricated in actual devices, will have three dimensions including length, width and depth.

Referring now to FIG. 1, a preferred embodiment of the present invention as applied to a monolithically integrated insulated gate semiconductor device generally designated 10 and comprising an inherent transistor, inherent thyristor and inherent TRIAC is shown. As used herein, the term "inherent" is used to designate those structures which, in contrast to their conventional counterparts, have one or more terminals not externally connected but which terminals are ordinarily directly connected to an external terminal in a conventional device. Thus in the device of the present invention, an inherent bipolar transistor exists in which the base terminal is not directly connected to an external terminal. Similarly, an inherent thyristor exists in which the emitter region is not directly connected to the cathode electrode. Insulated gates, however, are disposed within the device for coupling the various terminals of the inherent device to one or more external electrodes to thus take full advantage of the current conducting capabilities of the inherent structures.

The monolithically integrated insulated gate semiconductor device 10 of the present invention thus comprises a body of semiconductor material having a first layer 12, shown as a P type layer of one type conductivity, and a second layer 20 of opposite type conductivity and shown as a lightly doped N type layer disposed thereon. A first region 22 of opposite type conductivity is disposed within the first layer 12 and forms a PN junction therewith. The first region 22 in combination with the first layer 12, forms a first surface 25 of the device.

A second region 30 of one type conductivity shown as a P type region is disposed within the second layer 20 and forms a PN junction therewith. The second region 30 preferably includes a first heavily doped central portion 32 and a second more lightly doped peripheral portion 34 which surrounds the central portion 32 and is shallower than the central portion 32.

A third region 40 of one type conductivity is also disposed within the second layer and forms a PN junction therewith. The third region 40 is preferably disposed in opposed relation to the second region 30 and a portion of the second layer 20 is disposed therebetween. The third region 40 preferably includes a lightly doped first portion and a more heavily doped ohmic contact second surface portion 42.

A fourth region region 50 of opposite type conductivity is disposed within the second region 30 and forms a PN junction therewith. The fourth region 50 preferably comprises an annular structure having a portion of the second region 30 protruding in the center thereof. The fourth region 50, in combination with the second layer 20, defines a channel portion of the second region 30 therebetween. A fifth region 55 is disposed within the third region 40 and forms a PN junction therewith. The fifth region 55, in combination with the second layer 20, defines a channel portion of the third region 40 therebetween.

A sixth region 60 is disposed within the third region 40 and preferably is disposed within a portion of the ohmic contact portion 42 of the third region 40. The sixth region 60 is disposed is opposed relation to the fifth region 55 and a portion of the third region 40 intervenes between the fifth and sixth regions 55 and 60, respectively. A first insulated gate structure 65 couples the fourth region 50 to the second layer 20 in response to appropriate bias by establishing a conductive path through the channel portion of the second region 30. Similarly, a second insulated gate 68 is disposed above the channel portion of the third region 40 and couples the fifth region 55 to the second layer 20 in response to an appropriate applied bias. In an alternate preferred embodiment not shown, the first and second gates can be directly electrically connected or comprise portions of the same structure.

In addition, a third insulated gate structure 69 is provided to couple together the fifth and sixth regions 55 and 60, respectively, in response to an appropriate applied potential by establishing a conductive channel in the portion of the third region 40 disposed therebetween.

In a preferred embodiment, both the first and second and third insulated gate electrodes 65, 68 and 69, respectively, are connected to the same supply of control voltage. A first electrode 70 is disposed in ohmic contact with the ohmic contact portion 42 of the third region 40 as well as the sixth region 60 disposed therein. The first electrode 70 also makes ohmic contact with the second and fourth regions 30 and 50, respectively. A second electrode 72 is disposed in ohmic contact with the first layer in the first region and shorts the PN junction therebetween.

The device 10 conducts a high level of current in both the forward and reverse directions in response to the application of an appropriate bias to the insulated gates. When the second electrode 72 is biased more positively than the first electrode 70 and the third insulated gate 69 is appropriately biased, the fifth region 55 is coupled to the sixth region 60, which in turn is directly connected to the cathode electrodes 70. In addition, if the third insulated gate 69 is appropriately biased, the inherent four layer structure comprising the first layer 12, second layer 20, third region 40 and fifth region 55 is directly connected to the cathode electrode 70 and assumes a regenerative conducting state providing an active base drive to an inherent bipolar transistor comprising the first layer 12, the second layer 20 and the third region 40 including the second portion 42 thereof. In response to removal or reversal of the bias from the third insulated gate 69, the emitter of the four layer structure or the fifth region 55 is decoupled from the sixth region 60 and the first electrode 70 and conduction ceases.

In response to an appropriate bias applied to the first, second third insulated gates 65, 68 and 69, respectively and when the second electrode 72 is more negative than the first electrode 70, reverse conduction occurs in a four layer structure comprising the second region 30, the second layer 20, the first layer 12 and the first region 22. Accordingly, the inherent four layer structure provides regenerative conduction in the reverse direction. In response to application of the appropriate bias to first insulating gate electrode 65, regenerative conduction of the four layer ceases because the resulting conductive channel between fourth region 50 and layer 20 shorts the PN junction between region 30 and layer 20, reducing the injection from this junction and interrupting regenerative conduction. Therefore, the present invention provides for an improved monolithically integrated semiconductor device in which a high degree of conduction current density is achieved in both the forward and reverse directions at low voltage drops.

Figure 2A:
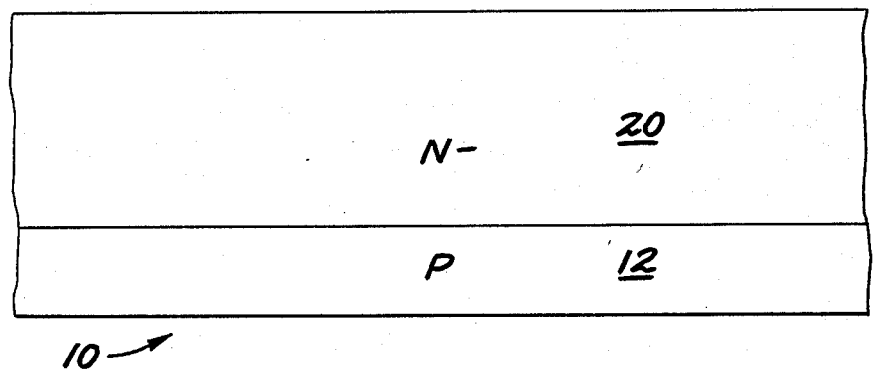
FIGS. 2A–2Y are illustrations of a cross-section of a monolithically integrated insulated gate semiconductor device in accordance with the present invention during successive stages in the process of fabricating that device.
Figure 2B:
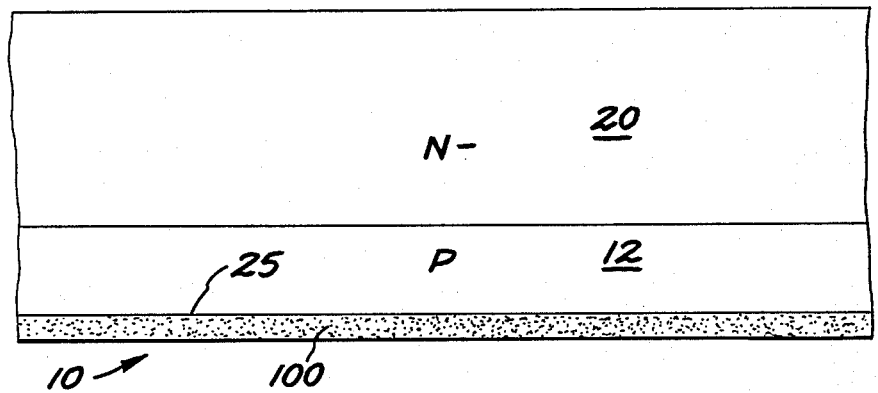
Figure 2C:
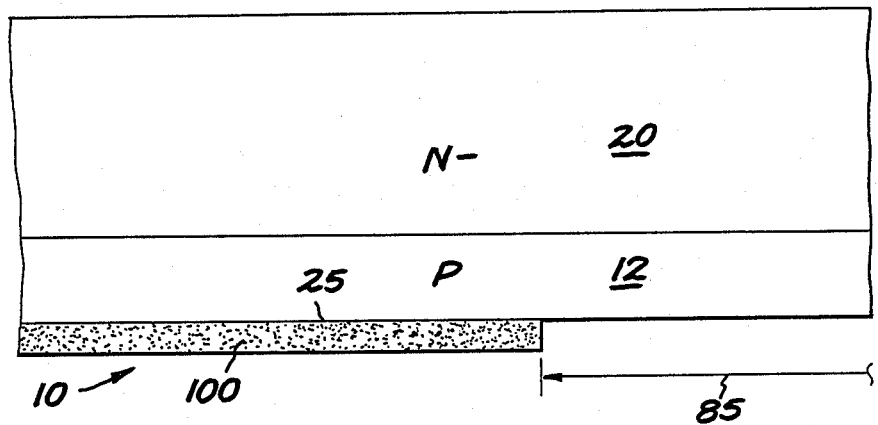
Figure 2D:
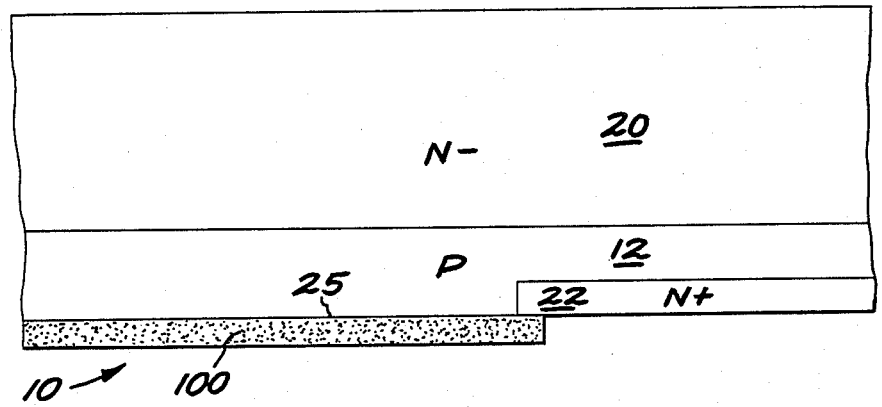
Figure 2E:
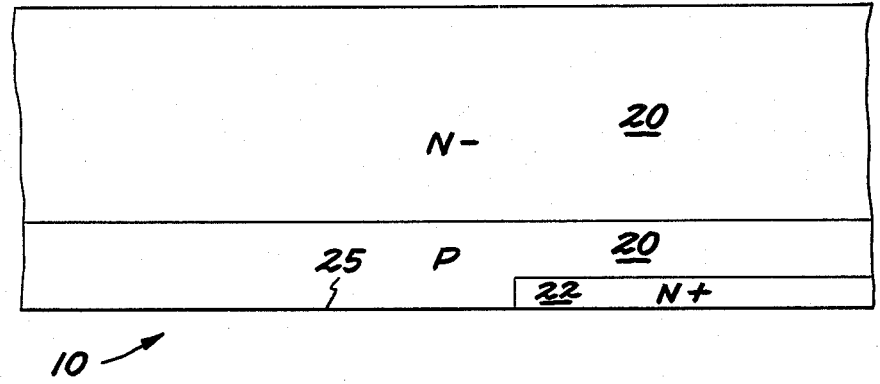
Figure 2F:
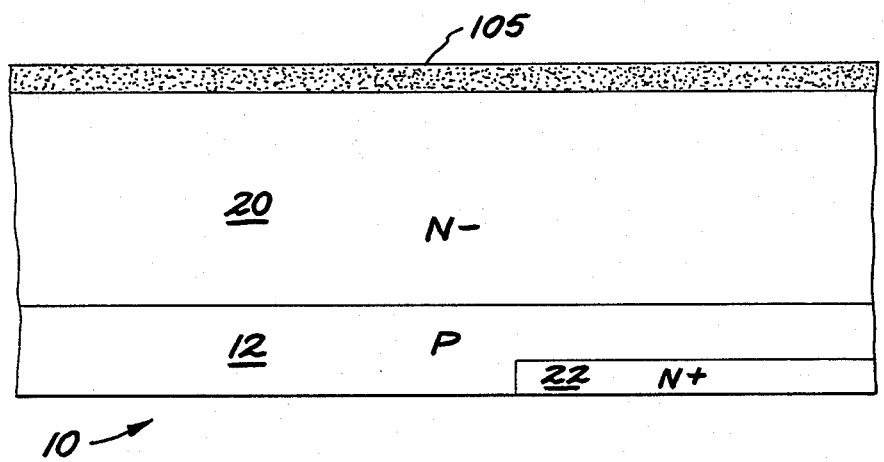
Figure 2G:
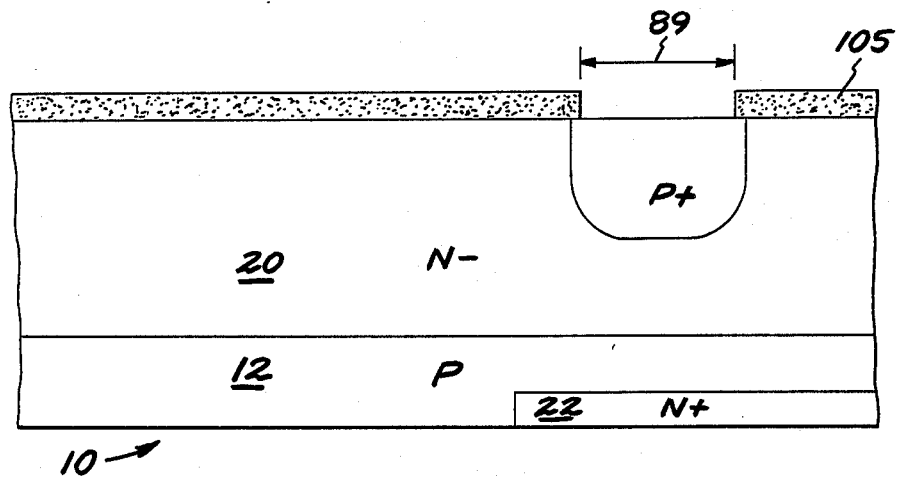
Figure 2H:
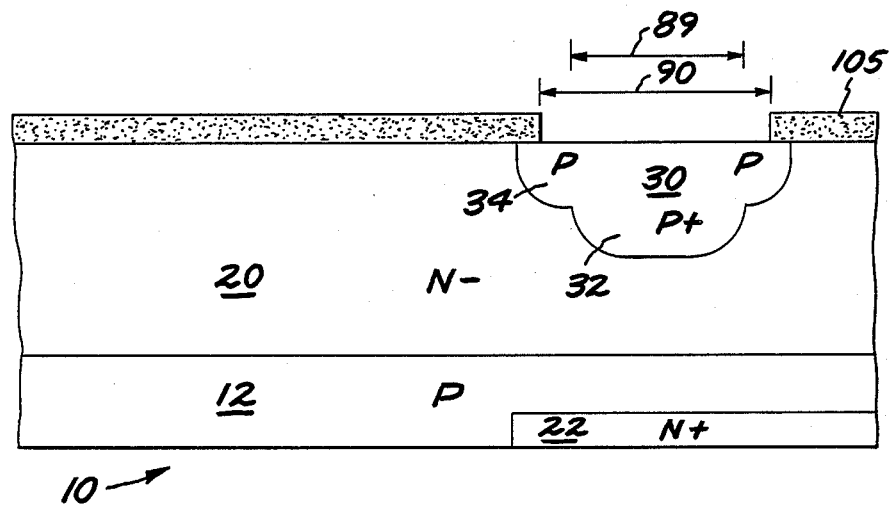
Figure 2I:
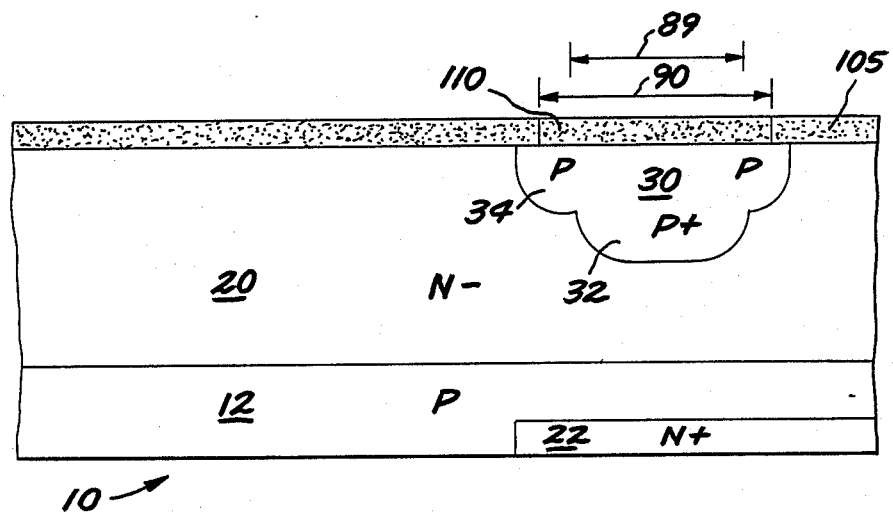
Figure 2J:
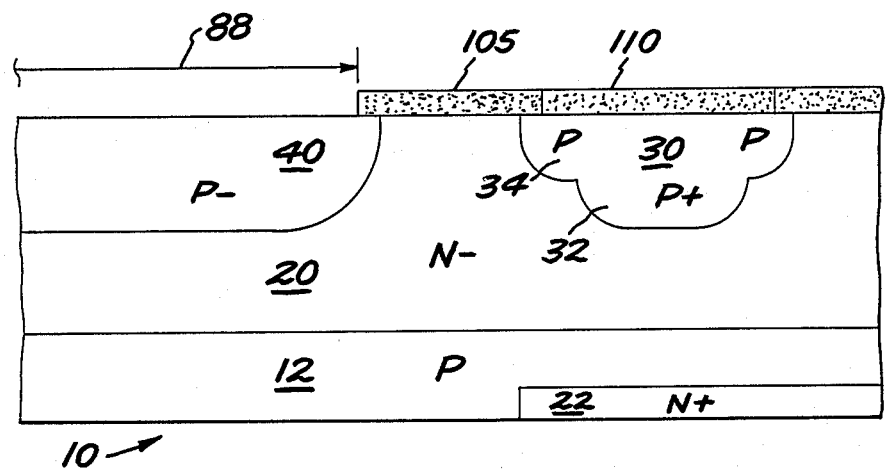
Figure 2K:
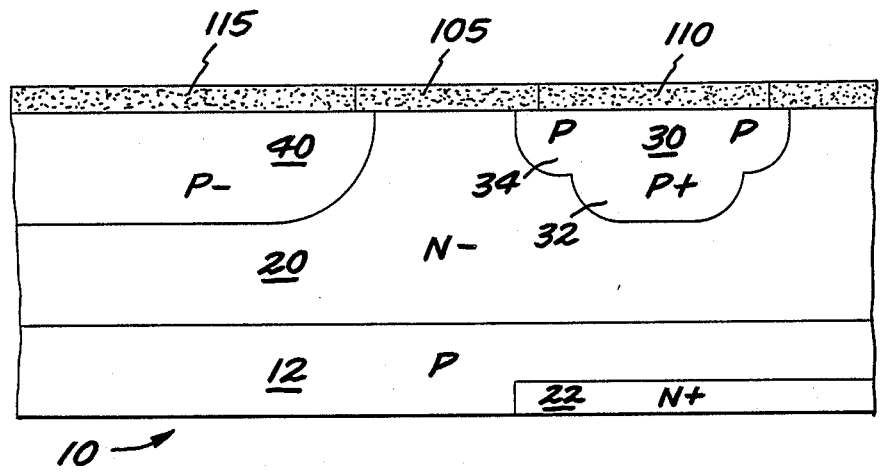
Figure 2L:
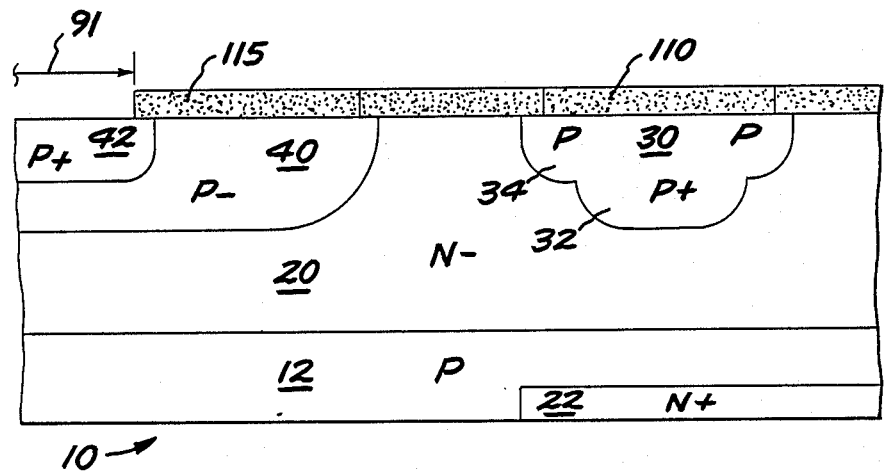
Figure 2M:
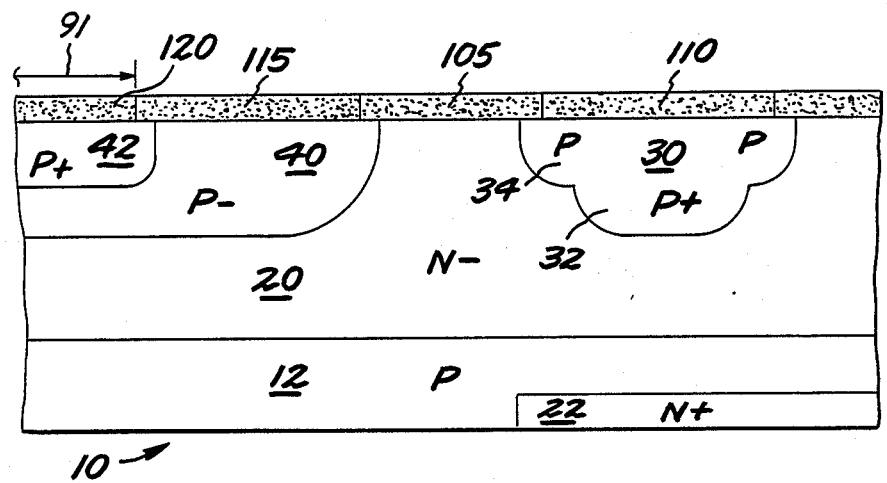
Figure 2N:
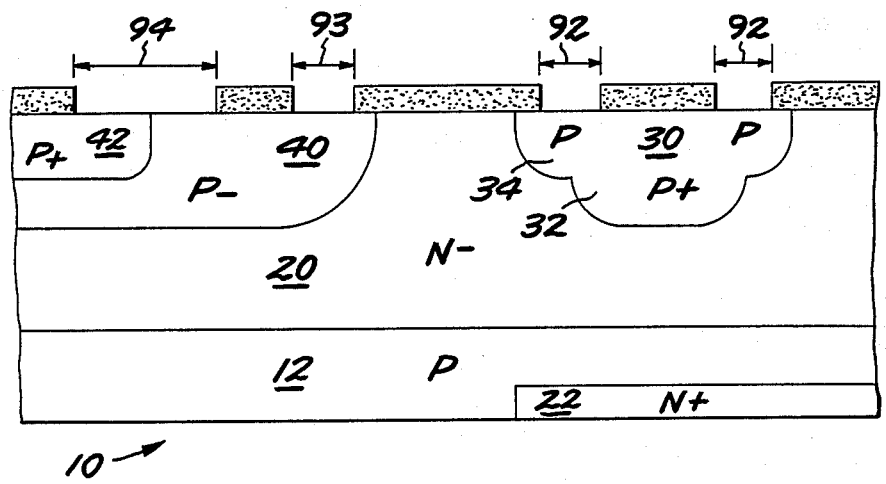
Figure 2O:
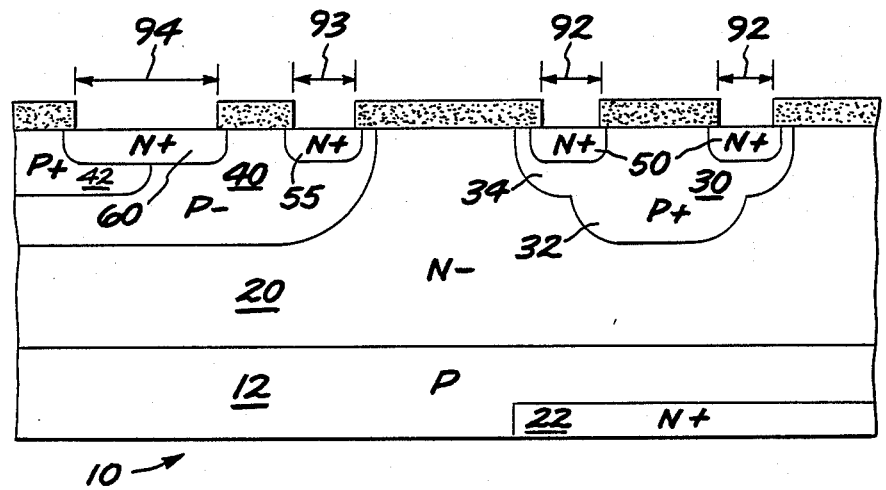
Figure 2P:
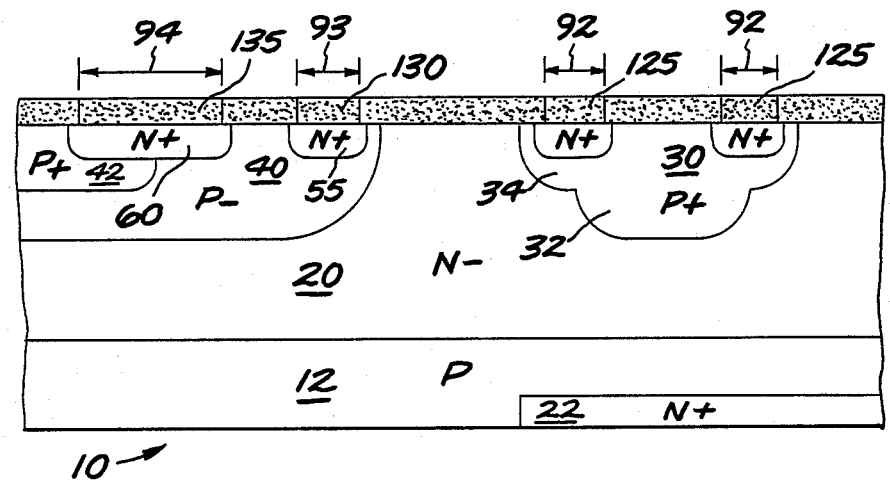
Figure 2Q:
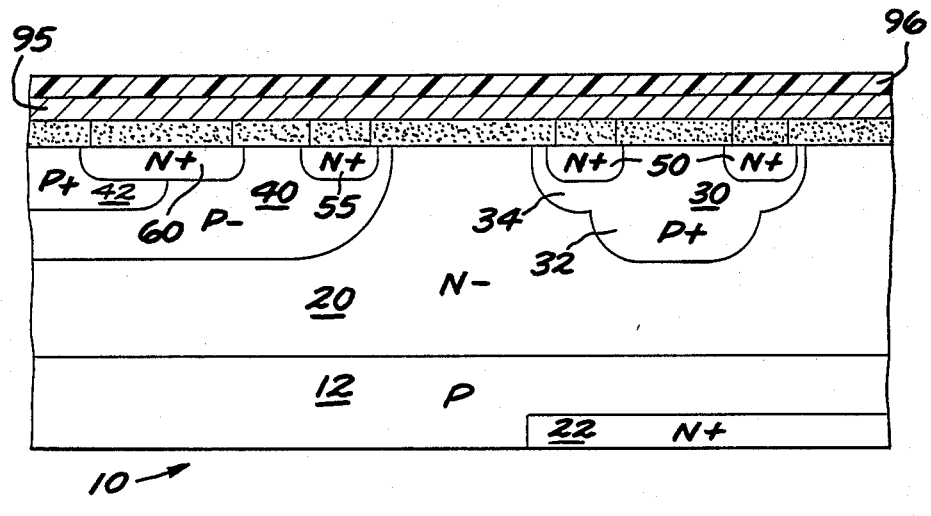
Figure 2R:
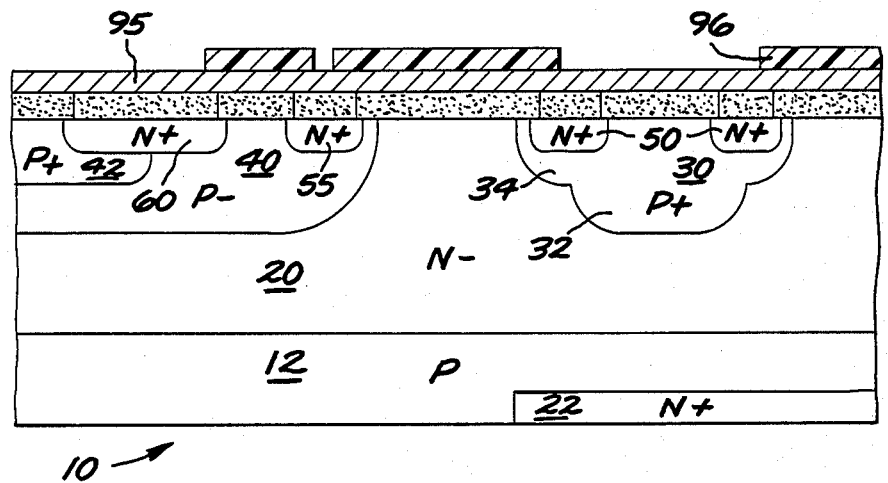
Figure 2S:
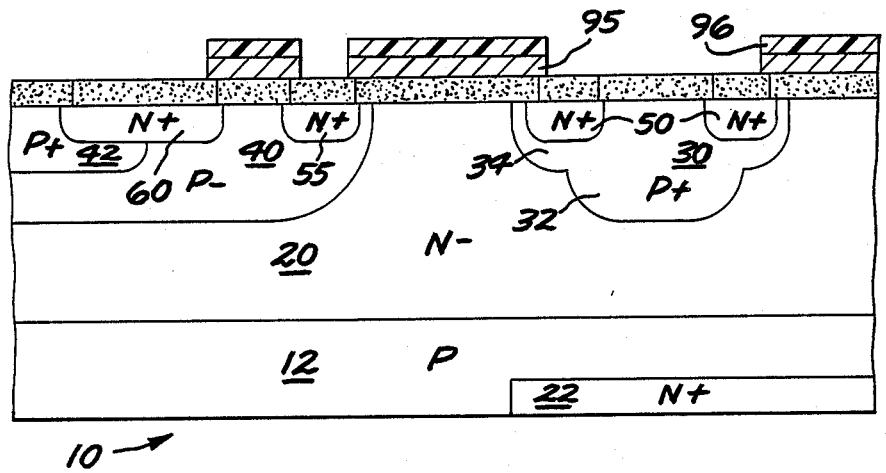
Figure 2T:
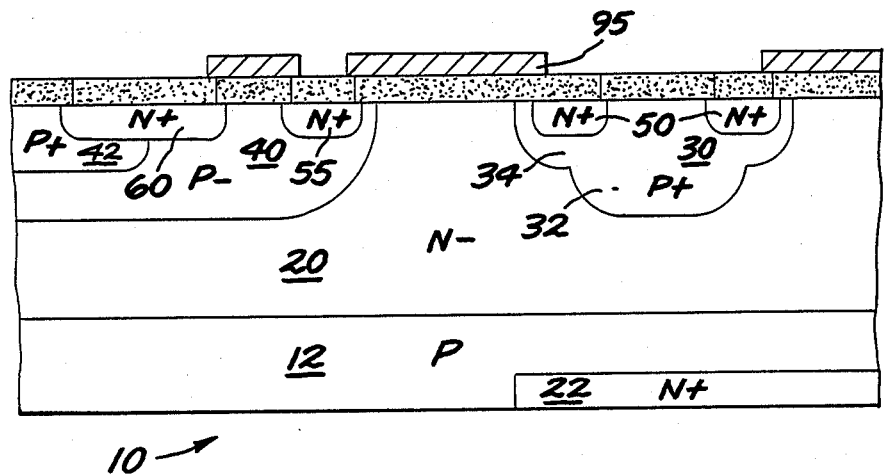
Figure 2U:
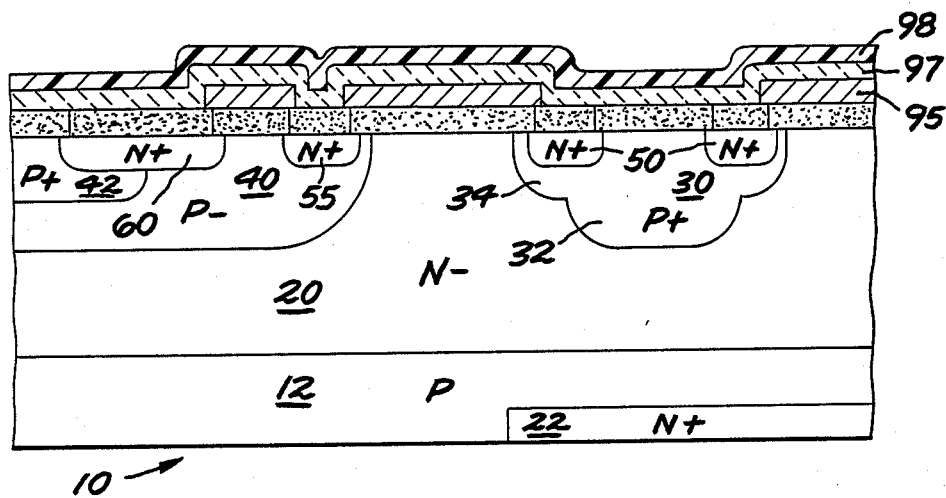
Figure 2V:
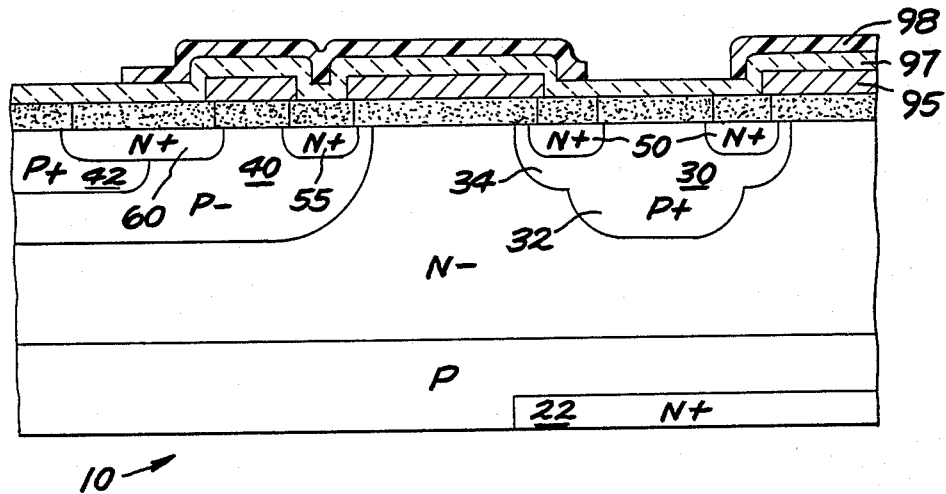
Figure 2W:
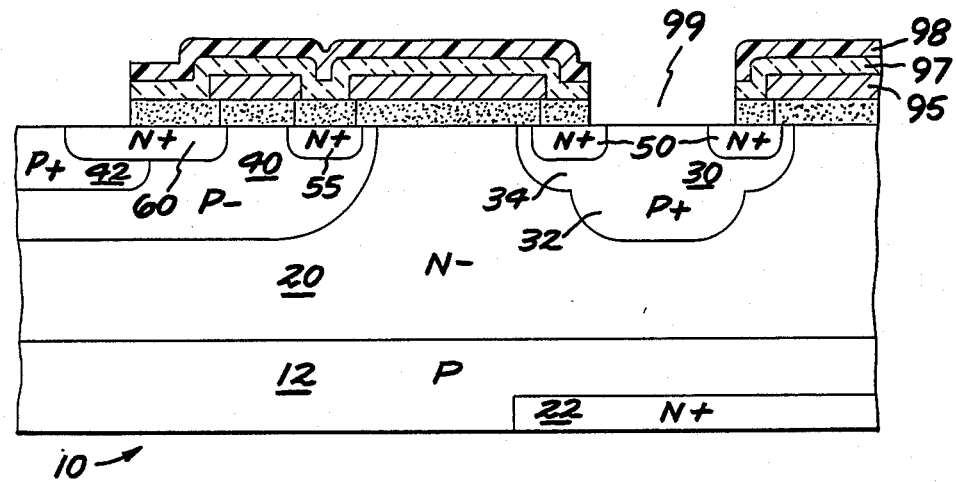
Figure 2X:
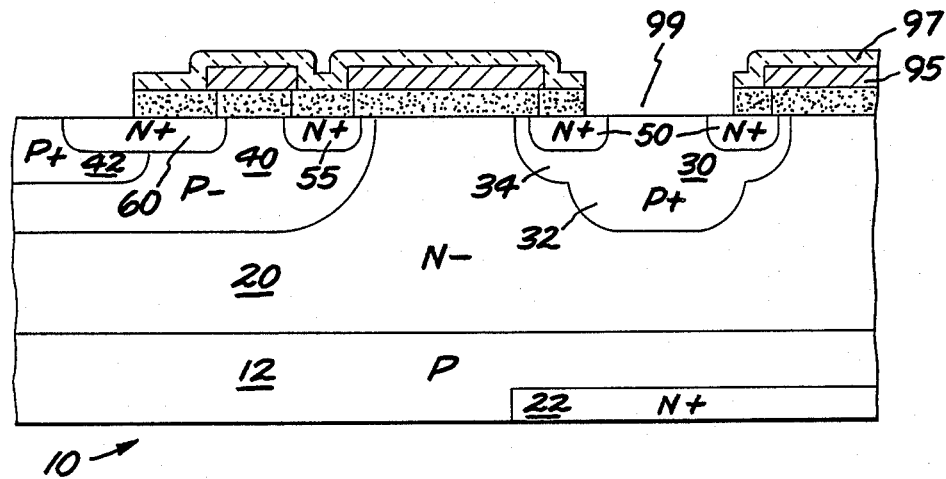
Figure 2Y:
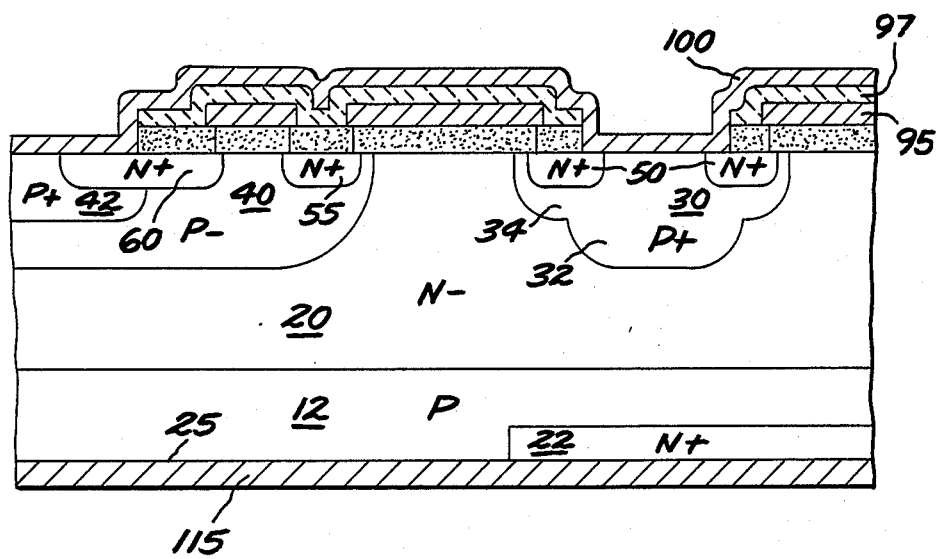

Referring now to FIGS. 2A–2Y, a preferred embodiment of a method of fabricating a monolithically integrated insulated gate semiconductor device in accordance with the present invention is shown to include the following steps. Initially, a body of semiconductor material comprising a first layer 12 of one type conductivity and a second layer 20 of opposite type conductivity is provided. As shown in FIG. 2B, initially, a first protective layer 100, such as an oxide layer, is provided on a first surface 25 of the semiconductor device. A first window 85, shown in FIG. 2C, is opened through the first protective layer 100. A first region 22, shown in FIG. 2D, is established within the first layer 12. Thereafter, the remaining portion of the first protective layer 100 is removed as shown in Figure 2E.

Thereafter, a second protective layer 105, shown in FIGS. 2F, is provided on a second surface of the semiconductor device 10.

Second and third windows 89 and 90 shown in FIGS. 2G and 2H, respectively are successively opened through the second protective layer 105 and first and second portions 32 and 34 of the one type conductivity second region 30 are successively established within the first layer 20. A third window 88 shown in FIG. 2I is opened.

More particularly, a second window 89 is initially opened in a first portion of the second protective layer 105. A heavy concentration of one type conductivity dopants is introduced to form a central portion 32 of the second region 30 within the second layer 20. Thereafter, a third window 90 is opened which surrounds the second window 89 and a second portion 34 of the second region 30 is established by introducing a moderate concentration of one type conductivity impurity into the exposed surface of the second layer 20. Thereafter, a third protective layer 110, shown in FIG. 2I, is deposited within the second window 90.

Subsequently, a third window 88 is opened through the second protective layer 105 as shown in FIG. 2J, and a light concentration of one type conductivity dopants is introduced to form a third region 40 within the second layer 20.

Subsequently, a fourth protective layer 115 is established in a portion of the third window 88 as shown in FIG. 2K, and a heavy concentration of one type conductivity dopant is introduced in through a fourth window 91 shown in FIG. 2L to establish a heavily doped ohmic contact region 42 within the third region 40. Thereafter, a fifth protective layer 120 is established within the fourth window as shown in FIG. 2M. Subsequently, fourth, fifth and sixth windows 92, 93 and 94, respectively as shown in FIG. 2N, are opened through the third, fourth and fifth protective layers 110, 115 and 120, respectively, and a heavy concentration of opposite type conductivity impurities introduced through the window to establish fourth, fifth and sixth regions 50, 55 and 60, respectively as shown in Figure 2O. Thereafter, sixth, seventh and eighth protective layers 125, 130 and 135, respectively are established within the fourth, fifth and sixth windows 92, 93 and 94, respectively, as shown in FIG. 2P. A gate layer 95 such as polysilicon is then deposited on the surface of the device 10 as shown in FIG. 2Q. Subsequently, a photolithographic layer 96 is deposited as is shown in FIG. 2Q, and patterned as shown in FIG. 2R using photolithographic techniques. The exposed portions of the gate layer 95 are removed by a suitable process as is shown in FIG. 2S and the photolithographic layer 96 is then removed as shown in FIG. 2T. Subsequently, a gate protective layer 97 is deposited atop the deposited gate material 95 and a second photolithographic layer 98 is deposited atop the gate protective layer 97 as shown in FIG. 2U. The photolithographic layer 98 is patterned as shown in FIG. 2V. Thereafter, electrode contact windows 99 are opened through the deposited layers as shown in FIG. 2W to expose a portion of the ohmic contact region 42 of the third region 40 as well as the sixth region 60. Further, portions of the second and fourth regions 30 and 50 are also exposed. Thereafter, the second photolithographic layer 98 is removed as shown in FIG. 2X and a metallization layer 100, shown in FIG. 2Y, is applied in the surface of the device to provide a cathode electrode 110 disposed in ohmic contact with the sixth and third regions 60 and 40, respectively and the fourth and second regions 50 and 30, respectively and electrically connecting the second, third and fourth and sixth regions. Thereafter, as shown in FIG. 2Y, an anode electrode 115 is applied to the first surface 25 in ohmic contact with the first region 22 and the first layer 12

In the device of FIG. 2Y, the first and second gate electrodes 68 and 65 of FIG. 1 are combined as a single insulated gate means. Thus, in FIG. 2Y, the gate electrode which corresponds to the third gate electrode 69 of FIG. 1 may be considered an additional gate electrode.

Thus, a monolithically integrated insulated gate semiconductor device has been provided in which an inherent bipolar transistor is driven by an insulated gate control active device to thereby drive the inherent bipolar transistor into fully turn-on state under forward conduction conditions, and under reverse conduction conductions, an insulated gate control thyristor is activated to provide for a similar low voltage high current density conduction. In both directions, the current is turned off by applying an appropriate bias to the insulated gates. Thus, the monolithically integrated insulated gate semiconductor device of the present invention is particularly appropriate for use in AC circuits.

While the preferred embodiments have been illustrated and described, it is clear that the present invention is not so limited. Numerous modifications and changes, variation and substitutions and equivalents will occur to those skilled in the art without departing from the true spirit and scope of the present invention. Accordingly, it is intended that the present invention herein be limited only by the scope of the appended claims.

What is claimed is:

1. A monolithically integrated insulated gate semiconductor device comprising:
   a first layer of one type conductivity;
   a second layer of opposite type conductivity
   a first region of opposite type conductivity disposed within said first layer said first layer and said first region each forming a portion of
   a first surface of said device;
   second and third regions of one type conductivity disposed in said second layer and forming PN junctions therewith;
   a fourth region of opposite type conductivity disposed within said second region, said second layer and said second and fourth regions each forming a portion of
   a second surface of said device;
   fifth and sixth regions of opposite type conductivity disposed within said third region and forming PN junctions therewith, said fifth and sixth regions being disposed in opposed relation with a portion of said third region disposed therebetween, said third, fifth and sixth regions each forming a portion of said second surface of said device;
   a first electrode disposed in ohmic contact with said second, third, fourth and sixth regions;
   a second electrode disposed in ohmic contact with said first layer and said first region;
   insulated gate means for coupling said fourth and fifth regions to said second layer; and
   an additional insulated gate structure for coupling said fifth region to said sixth region.

2. The semiconductor device of claim 1 wherein said third region includes a heavily doped ohmic contact portion.

3. The semiconductor device of claim 1 wherein said sixth region overlaps said ohmic contact portion.

4. The semiconductor device of claim 1 wherein, at said second surface, said second region comprises a heavily doped central portion and a lightly doped peripheral portion.

5. The semiconductor device of claim 4 wherein said peripheral portion of said second region is shallower than said central portion of said second region and surrounds a portion of said central portion.

6. The semiconductor device recited in claim 1 wherein:
   said fifth region is free of ohmic connections to said first electrode.

7. The semiconductor device of claim 6 wherein said third region includes a heavily doped ohmic contact portion.

8. The semiconductor device of claim 1 wherein said second region forms a first junction wtih said second layer and said first junction is reverse biased under forward operating conditions.

9. The semiconductor device of claim 1 wherein said second layer forms a second junction with said first layer and said second junction is reverse biased under reverse operating conditions.

10. The semiconductor device recited in claim 1 wherein said insulated gate means comprises:
    a first insulated gate structure for coupling said fifth region to said second layer; and
    a second insulated gate structure separate from said first insulated gate structure for coupling said fourth region to said second layer.

11. The semiconductor device of claim 10 wherein when a main bias is applied across said first and second electrodes of a polarity to cause reverse conduction and said device is conducting:
    said second insulated gate, in response to the application of an appropriate bias, couples said fourth region to said second layer to interrupt conduction in a four layer structure comprising said first region, said first layer, said second layer and said second region.

12. The semiconductor device of claim 1 wherein when a main bias is applied across said first and second electrodes of a polarity to cause forward conduction and said device is conducting:
    said additional insulated gate, in response to the application of an appropriate bias, decouples said fifth region from said sixth region to interrupt current flow in a four layer structure comprising said first and second layers and said third and fifth regions.

13. The semiconductor device of claim 10 wherein said fourth region, in combination with said second layer, defines a channel portion of said second region and said second insulated gate is disposed above said channel portion of said second region.

14. The semiconductor device of claim 10 wherein said fifth region, in combination with said second layer, defines a channel portion of said third region and said first insulated gate is disposed above said channel portion of said second region.

15. The semiconductor device of claim 6 wherein said sixth region overlaps said ohmic contact portion.

16. The semiconductor device of claim 6 wherein, at said second surface, said second region comprises a heavily doped central portion and a lightly doped peripheral portion.

17. The semiconductor device of claim 16 wherein said peripheral portion of said second region is shallower than said central portion of said second region and surrounds a portion of said central portion.

18. The semiconductor device recited in claim 6 wherein said insulated gate means comprises:
    a first insulated gate structure for coupling said fifth region to said second layer; and
    a second insulated gate structure separate from said first insulated gate structure for coupling said fourth region to said second layer.

19. The semiconductor device of claim 18 wherein said fourth region, in combination with said second layer, defines a channel portion of said second region and said second insulated gate is disposed above said channel portion of said second region.

20. The semiconductor device of claim 18 wherein said fifth region, in combination with said second layer, defines a channel portion of said third region and said first insulated gate is disposed above said channel portion of said second region.

21. The semiconductor device of claim 12 wherein said second region forms a first junction with said second layer and said first junction is reverse biased under forward operating conditions.

22. The semiconductor device of claim 6 wherein said second layer forms a second junction with said first layer and said second junction is reverse biased under reverse operating conditions.

23. The semiconductor device of claim 18 wherein when a main bias is applied across said first and second electrodes of a polarity to cause reverse condition and said device is conducting:

said second insulated gate, in response to the application of an appropriate bias, couples said fourth region to said second layer to interrupt conduction in a four layer structure comprising said first region, said first layer, said second layer and said second region.

24. The semiconductor device of claim 6 wherein when a main bias is applied across said first and second electrodes of a polarity to cause forward conduction and said device is conducting:

said additional insulated gate, in response to the application of an appropriate bias, decouples said fifth region from said sixth region to interrupt current flow in a four layer structure comprising said first and second layers and said third and fifth regions.

* * * * *